United States Patent [19]
Bontempo et al.

[11] Patent Number: 5,710,690
[45] Date of Patent: Jan. 20, 1998

[54] METHOD AND APPARATUS FOR PROTECTING AN INTEGRATED CIRCUIT FROM CURRENT OVERLOAD

[75] Inventors: Gregorio Bontempo, Barcellona; Francesco Pulvirenti, Acireale; Paolo Colletti, Messina; Roberto Gariboldi, Lachiarella, all of Italy

[73] Assignee: Consorzio per la Ricerca sulla Microelettronica nel Mezzogiorno, Catania, Italy

[21] Appl. No.: 488,885

[22] Filed: Jun. 9, 1995

[30] Foreign Application Priority Data

Jun. 10, 1994 [EP] European Pat. Off. ............ 94830284

[51] Int. Cl.$^6$ ................................................. H02H 3/18
[52] U.S. Cl. ................... 361/94; 361/87; 361/97; 364/483; 364/490
[58] Field of Search ................ 361/98, 87, 83, 361/59, 74, 93–94, 96–99; 364/490, 481, 483, 489

[56] References Cited

U.S. PATENT DOCUMENTS

| | | | |
|---|---|---|---|
| 5,091,816 | 2/1992 | Juntenen | 361/18 |
| 5,432,945 | 7/1995 | Pergent et al. | 395/750 |

*Primary Examiner*—Jeffrey A. Gaffin
*Assistant Examiner*—Michael Sherry
*Attorney, Agent, or Firm*—Wolf, Greenfield & Sacks, P.C.; James H. Morris; Brett N. Dorny

[57] ABSTRACT

A non-dissipative device for protecting an integrated circuit having multiple independent channels against overloading. The non-dissipative device includes an input terminal and an output terminal having an integrated switch connected therebetween which consists of an input portion, a logic gate with two inputs a control portion, and an output portion, all connected in series with one another. The device further includes a generating circuit for generating the on-times and off-times of the integrated switch, the generating circuit is connected between an output of the output portion and an input of the logic gate.

39 Claims, 4 Drawing Sheets

METHOD AND APPARATUS FOR PROTECTING AN INTEGRATED CIRCUIT FROM CURRENT OVERLOAD

BACKGROUND OF THE INVENTION

1. Field of the Invention

This invention relates to a non-dissipative device for protecting an integrated circuit having multiple independent channels against current overloading.

Specifically, the invention concerns a non-dissipative device for the current overload protection of an integrated circuit having multiple independent channels, which device comprises an input terminal and an output terminal having an integrated switch connected therebetween which consists of a first or input portion, a two-input logic gate, a second or control portion, and a third or output portion, all in series with one another.

The invention further relates to a method for timing an integrated switch on and off under a short condition, the switch being connected in an integrated circuit having multiple channels, and which includes a counter block and a storage element.

2. Discussion of the Related Art

As is known, in the field of industrial process controllers, control channels or lines which are powered at voltages exceeding 20 volts are amply used.

Most actuators, e.g. relays, solenoid valves, light indicators, heaters, etc., are driven from a control line relative to ground.

Switches of the integrated type, the so-called IPS's (Intelligent Power Switches), are especially useful for driving such actuators. IPS's, in fact, can be implemented using BiCmos/Dmos technologies such that they can be operated at high voltages (on the order of 60 volts).

Furthermore, IPS's implemented in BiCmos/Dmos technologies exhibit negligible saturation power compared to that of actuators.

The usual topology employed for integrated switches is one known as a High Side Driver and is shown in FIG. 1.

Shown at 1 in that figure is a general IPS type of integrated switch implemented in BiCmos/Dmos technology.

Such a switch 1 has an input terminal IN and an output terminal OUT. Connected serially between these terminals are a first or input portion 2, a second or control portion 3, and a third or output portion 4.

The first or input portion 2 basically includes a comparator 5 having a first input terminal I1 which is the terminal IN, and a second input terminal I2 connected to a voltage reference Vbg.

The second or control portion 3 is connected to the output of the input comparator 5 and includes a driver circuit 6 connected to a supply voltage pole Vcp.

The third or output portion 4 includes a DMOS transistor 7, i.e. a field-effeCt transistor, or an n-channel MOS.

The DMOS transistor 7 has its drain D1 and gate G1 terminals connected to each other through a series of two diodes DI2 and DI3, with the latter being a zener diode.

In addition, the drain terminal D1 is connected to a supply voltage pole Vs, while the source terminal S1 is connected to the output terminal OUT.

The High Side Driver operates as follows.

When the voltage at input IN is lower than the voltage Vbg, the DMOS transistor 7 is off, i.e. non-conducting, and the output OUT has a high impedance; under this condition, the integrated switch 1 is said to be "open".

When the voltage at the input IN is higher than the voltage Vbg, the DMOS transistor 7 is on, i.e. in the conduction area, and establishes an electrical connection between the output OUT and the supply voltage pole Vs. The output OUT has a very low impedance equal to the resistance Rdson between the source terminal S1 and the drain terminal D1 of the DMOS transistor 7 in the conduction area; under this condition, the integrated switch is said to be "closed".

If the output OUT of the integrated switch 1 in the "closed" state were connected to ground, producing a short, the current flowing through the DMOS transistor 7 could become quite high, being limited only by the small impedance Rdson and the connections to the load of the switch 1.

A high current value can lead to breakage of the assembling wires or failure of the switch. Therefore, the shorting current of the integrated switch 1 should be kept low.

One prior solution consists of keeping this current at a controlled low value. The DMOS 7 is held there shorted at the controlled low value until the temperature of the integrated circuit reaches a threshold value Ts which triggers on a thermal protection for the switch, while turning off the DMOS transistor 7.

Actually, this prior solution is disadvantageous in that the integrated switch, with a continued shorted condition, goes in and out of the thermal protection range, and is alternately heated and cooled about the threshold temperature Ts (which is usually on the order of 170° C.), whereby its reliability undergoes long term deterioration.

To overcome this problem, the prior art has proposed the use of non-dissipative protection devices.

Such devices remain in the shorted condition with a controlled current for an appropriate time interval Ton during which the integrated switch will rise to a temperature Tr, turn off the DMOS transistor 7 for a second predetermined time interval Toff, and if necessary, repeat this operation until the switch comes out of the shorted condition. In this way, the temperature of the integrated switch is at all times below the threshold temperature value Ts.

FIG. 2 of the appended drawings shows graphically this temperature pattern plotted versus time.

The graph illustrates how the protective device allows a maximum temperature Tr of the integrated switch to be attained which is far lower than the thermal protection cut-in temperature Ts.

Such a means of protection is more reliable than that provided by thermal protection alone.

The duration of the time interval Ton is vital to loads of a capacitive nature, filament lamps, etc.. In fact, such loads present a very low turn-on resistance and are seen by the protection device as shorted loads; accordingly, during the time interval Ton, the load capacitance is allowed to become charged.

The circuit arrangement in the prior art type of protection is shown in FIG. 3, and may be regarded as a development of the device in FIG. 1.

The output O1 of the comparator 5 is connected to the input of the driver circuit 6 by a logic gate PL1 of the AND type having two inputs I3, I4 and an output O2. Furthermore, the drain terminal D1 of the DMOS transistor 7 is connected to a supply voltage reference Vs through a resistor Rs.

Connected across the resistor Rs are the input terminals of an operational amplifier 9 which has a first output terminal O3 connected in feedback to the driver circuit 6 and a second output terminal O4 connected to a series of two delay blocks 10 and 11.

The delay blocks 10 and 11 are connected to the same voltage reference Vr and to a capacitor, C1 and C2 respectively.

The second delay block 11 is connected to the second input I4 of the logic gate PL1.

With the circuit architecture of FIG. 3, the current flowing through the load is passed through the resistor Rs and is sensed at the input terminals of the operational amplifier 9 as a voltage Vrs=Rs*Icc.

When the load current exceeds the highest current for which the DMOS transistor 7 has been designed, any consequent increase in the voltage Vrs across Rs triggers on the control loop 12 formed by the negative feedback of the operational amplifier 9 to the driver circuit 6.

Thus, the driver circuit 6 keeps the current flowing through the DMOS transistor 7 within its designed limit.

At the same time, the output O4 from the operational amplifier 9 will be acting on the first delay block 10, whose time lag Ton is set by a charging of the capacitor C1 and the reference voltage Vr.

After the time interval Ton, the voltage VC1 on the capacitor C1 will be higher than the reference value Vr, and the output O5 of the first delay block 10 will go to a logic high, causing the capacitor C2 to discharge and pulling to zero the output O6 of the second delay block 11.

The logic low state of the output O6 of the second delay block 11 also pulls down the output O2 of the logic gate PL1, which will turn off the driver circuit 6.

At this point, there will be no current flowing through the load, and hence nor through Rs, and the control loop 12 becomes disabled; the output O4 of the operational amplifier 9 is at a logic low, causing the capacitor C1 to be discharged and pulling to zero the output O5 of the first delay block 10.

The transition of the signal at the output O5 of the first delay block 10 causes the capacitor C2 to be charged to a voltage VC2. The time interval Toff is set by a charging of C2 and the threshold reference voltage Vr.

After the time interval Toff, the voltage VC2 on the capacitor C2 will exceed the reference value Vr, the value of the output O6 of the second delay block 11 will be restored to a logic high, and control of the DMOS transistor 7 handed back to the comparator 5 of the first input circuit portion 2.

If the abnormal operating condition continues, the whole procedure repeats along with a request to turn on the integrated switch 1.

This prior art circuit has disadvantages when used for protecting integrated circuits having multiple control channels, which are shorted, or which are driving different capacitive loads. When this solution is applied to multiple control channel IC's, one can adopt two different solutions, but neither is devoid of drawbacks.

In the first solution one set of two capacitors C1 and C2 can be used for all the channels in the integrated circuit.

An obvious disadvantage of this solution is that the channel times Ton and Toff are dependent on the first channel to be shorted.

In the second solution a respective distinct pair of capacitors C1 and C2 can be used for each channel in the integrated circuit.

A disadvantage of the last solution is the inordinate increase in the area occupied by multiple integrated capacitors, or the necessity of two terminating contacts for each channel if external capacitors are used.

The present invention provides an overload protection device for an integrated circuit having multiple independent channels, which overcomes the drawbacks in the prior art.

SUMMARY OF THE INVENTION

The present invention uses a single capacitor to generate a common time base shared by all the channels of an integrated circuit, and achieves independence of time intervals Ton and Toff for each channel by employing memories of the EPROM or EEPROM type.

According to one aspect of the present invention, an integrated circuit having at least one channel is protected from a current overload at any channel. Upon a detection of a short at any channel, any shorted channel is cyclically driven with a respective cycle defined by a Ton and Toff. The Ton and Toff for each channel is generated from a respective counter and from an oscillator having a frequency defined by a common time base generated by a single capacitor. The respective Ton and Toff for each channel are stored in memory and serve as a start count value in the counter.

The features and advantages of the apparatus and the method according to this invention will become apparent from the following detailed description of an embodiment thereof, to be taken by way of example only and not as a limitation, in conjunction with the accompanying drawings.

DETAILED DESCRIPTION

Figure 1:
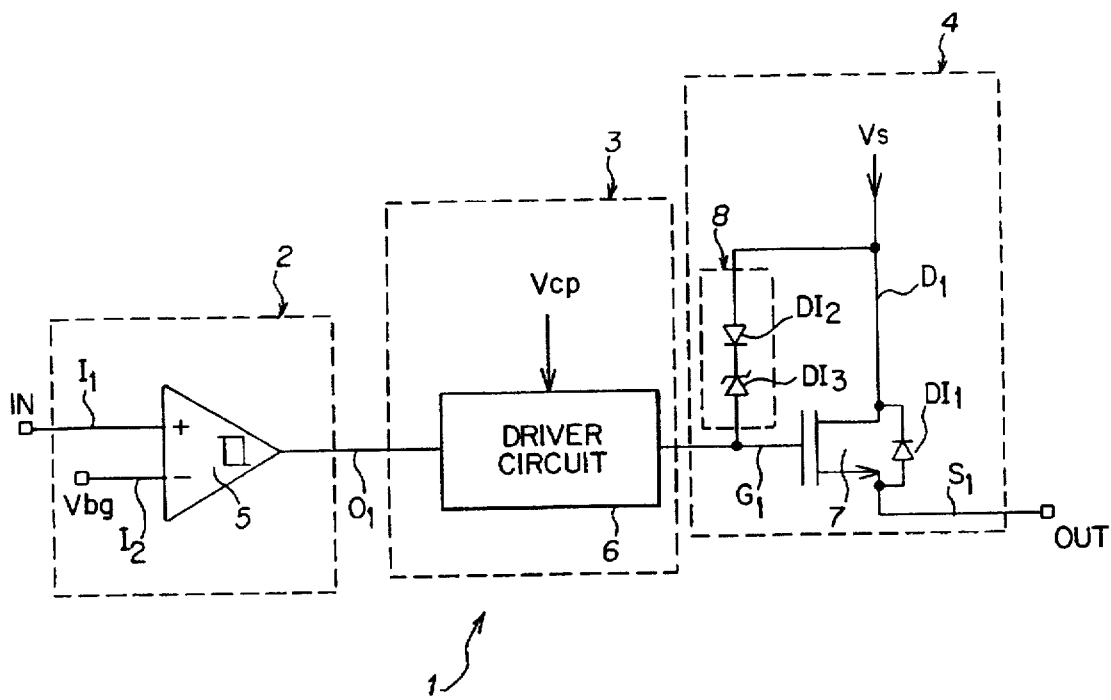
FIG. 1 shows an integrated switch.
Figure 2:
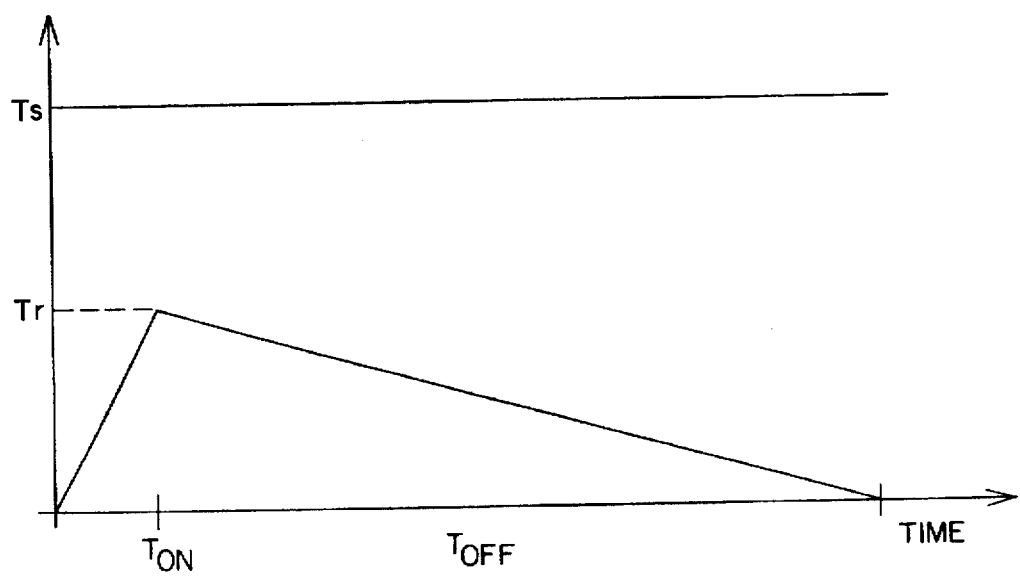
FIG. 2 is a plot of temperature vs. time for the switch of FIG. 1.
Figure 3:
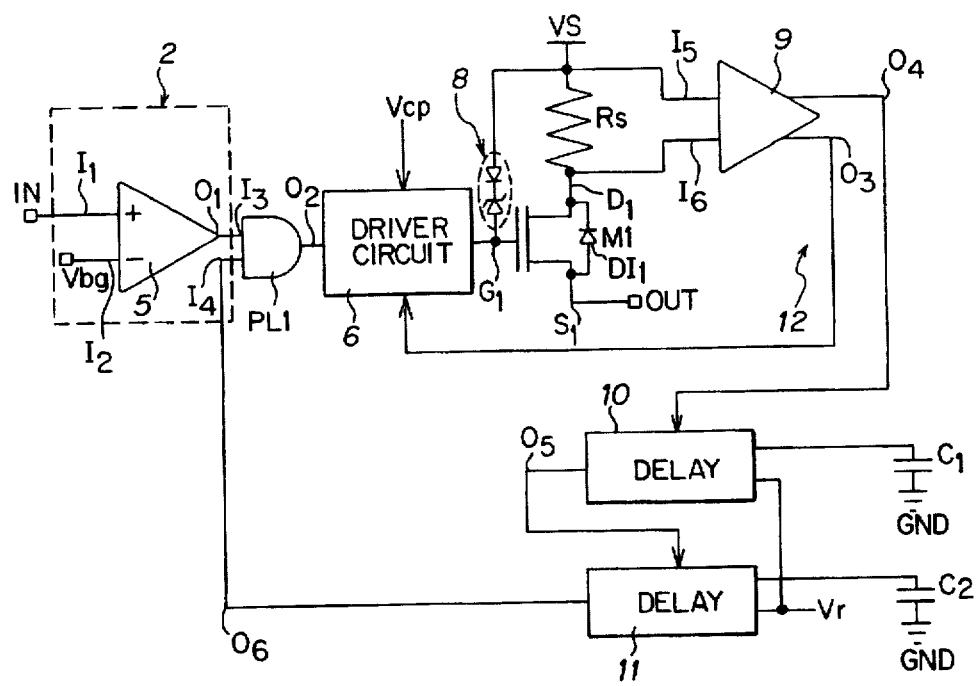
FIG. 3 illustrates an overload protection device.

In reference to the figures, shown as 13 is a general non-dissipative, overload protection device according to the present invention.

The device 13 is intended to protect an integrated circuit, not illustrated because conventional.

The protection device 13 has an input terminal IN and an output terminal OUT with an integrated switch 1 of a known type connected therebetween.

The integrated switch 1 includes a series of a first or input circuit portion 2 including a comparator 5, a second circuit portion 3 with control function which includes a driver circuit 6, and a third or output circuit portion 4 including a DMOS transistor and a series of diodes 8.

Connected between the comparator 5 and the driver circuit 6 is a first logic gate PL1 of the AND type having two inputs, I3 and I4, and an output O2.

The DMOS transistor 7 has its drain terminal D1 connected to a supply voltage reference Vs through a resistor Rs having two inputs, I5 and I6, of an operational amplifier 9 connected across it.

The operational amplifier 9 has a first output O3 connected to the driver circuit 6 in a feedback loop 12.

In accordance with the invention, connected between a second output O4 of the operational amplifier 9 and the second input I4 of the first logic AND gate PL1, is a circuit A to generate the on-times Ton and off-times Toff of the integrated switch 1.

Specifically, the second output O4 of the operational amplifier 9 is connected to a first input I7 of a second logic AND gate PL2 having two inputs I7, I8 and an output O7.

The second input I8 of the logic AND gate PL2 is connected to an oscillator 14 of the free running type, and the oscillator is connected to ground via a capacitor C1.

The output O7 of the logic AND gate PL2 is connected to the input of a counter block 15 which is connected, in turn, to the input I4 of the first logic AND gate PL1 and to a storage block 16. The memory 16 supplies the counter block 15 with the values of the on- and off-times Ton and Toff, respectively over buses 17 and 18.

Such a device 13 can be implemented using BCD (Bipolar CMOS DMOS) technologies, which allow memory cells, signal components and power components to be integrated on a same integrated circuit.

The protection provided by this device is based on the generation of a common time base for all the channels of the integrated circuit to which the device is applied.

For this purpose, the device 13 uses the free running oscillator 14, whose oscillation frequency Fosc is inversely proportional to the capacitance value of the capacitor C1. For example, an oscillation frequency can be obtained as follows:

$$Fosc = K/C1 \quad (1)$$

The resultant time base is used in the present invention as a clock signal for the counter block 15 which is to count the times Ton and Toff.

The number of clock pulses counted by the counter block 15 is controlled by the storage block 16.

In particular, the time intervals Ton and Toff are obtained by suitable selection of the count start value, which would be different for each channel to be controlled.

In the present invention, such start values for the individual channels are stored in the storage block 16.

The operation of the device according to the invention will now be discussed.

When the output OUT of the device 13 is connected to ground, the signal at the output O4 of the operational amplifier 9, as generated by the control loop 12 between the amplifier and the driver circuit 6, goes from a logic low (logic "0") to a logic high (logic "1").

Through the logic AND gate PL2, this signal triggers on a counting in the counter block 15, with the time base set by the oscillator 14, to the on-time Ton and off-time Toff.

At the start of this count, the initial state of the counter block 15 is loaded from the storage block 16 for the channel of interest, thereby loading into the counter block 15 a pattern of bits that generates the appropriate on-time interval Ton.

The counting proceeds in accordance with this pattern of bits which, during the time interval Ton, will be brought to a logic value of "1". During this starting stage of the count, the current through the DMOS transistor 7 is set at a controlled low value.

If, during the counting, the short condition at the output OUT is terminated, the counter block 15 is clamped, and the whole device 13 is restored to its normal operation.

At the end of the time interval Ton, the driver circuit 6 turns off DMOS transistor 7 regardless of the control signal at the input IN, and the count starting value for the off-time Toff is then loaded from the storage block 16.

At this point, a second counting stage starts for the time interval Toff, during which the DMOS transistor 7 would be held off.

At the end of the second counting stage, control of the driver circuit 6 is returned to the input circuit portion 2, whereupon the device 13 will be ready to signal again the presence of a short by re-initiating the sequence of operations just described.

Figure 5:
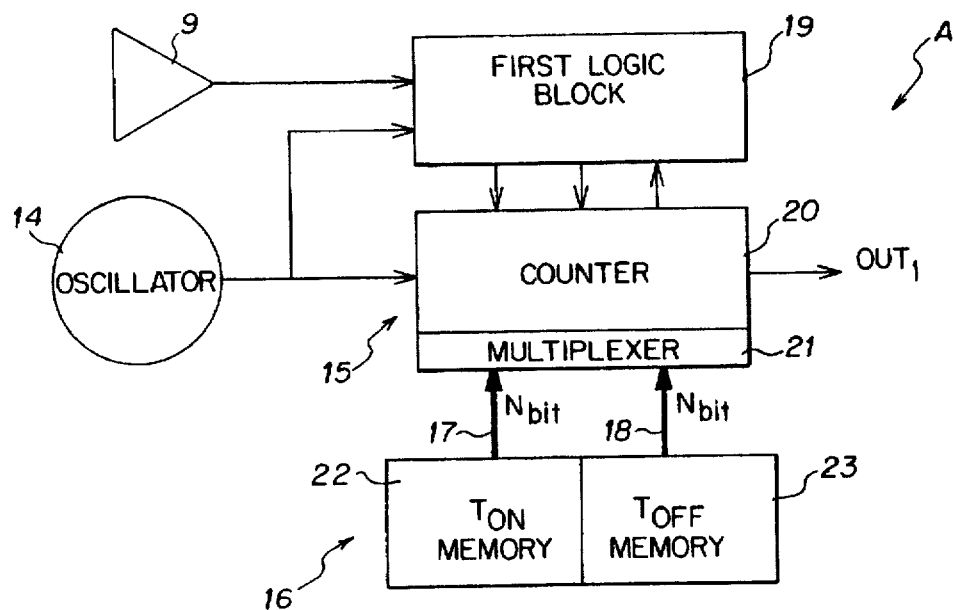
FIG. 5 shows in greater detail a portion of the circuit in FIG. 4.

FIG. 5 shows in greater detail the components of the counter 15 and the memory 16, as shared in common by all the channels.

The operational amplifier 9 is connected to a first logic block 19 which is in turn connected to the oscillator 14 and the counter block 15.

The counter block 15 includes a counter 20 and a multiplexer sub-block 21, and is connected to the storage block 16 which is comprised of a first memory 22 arranged to contain the start value for counting to the on-time interval Ton, and a second memory 23 containing the start value for counting to the off-time interval Toff.

In the preferred embodiment of the device 13 according to the invention, the memories 22 and 23 are of the EEPROM type.

If N is used to denote the number of counting elements (flip-flops) in the counter block 15, then the longest possible on- and off-times, Ton and Toff, are determined by the oscillation frequency of the oscillator 14 as follows:

$$T(on,off) = 2^N / Fosc \quad (2)$$

The memories 22 and 23 are connected to the multiplexer sub-block 21 by buses 17 and 18, respectively.

The circuit of FIG. 5 operates as follows.

Figure 4:
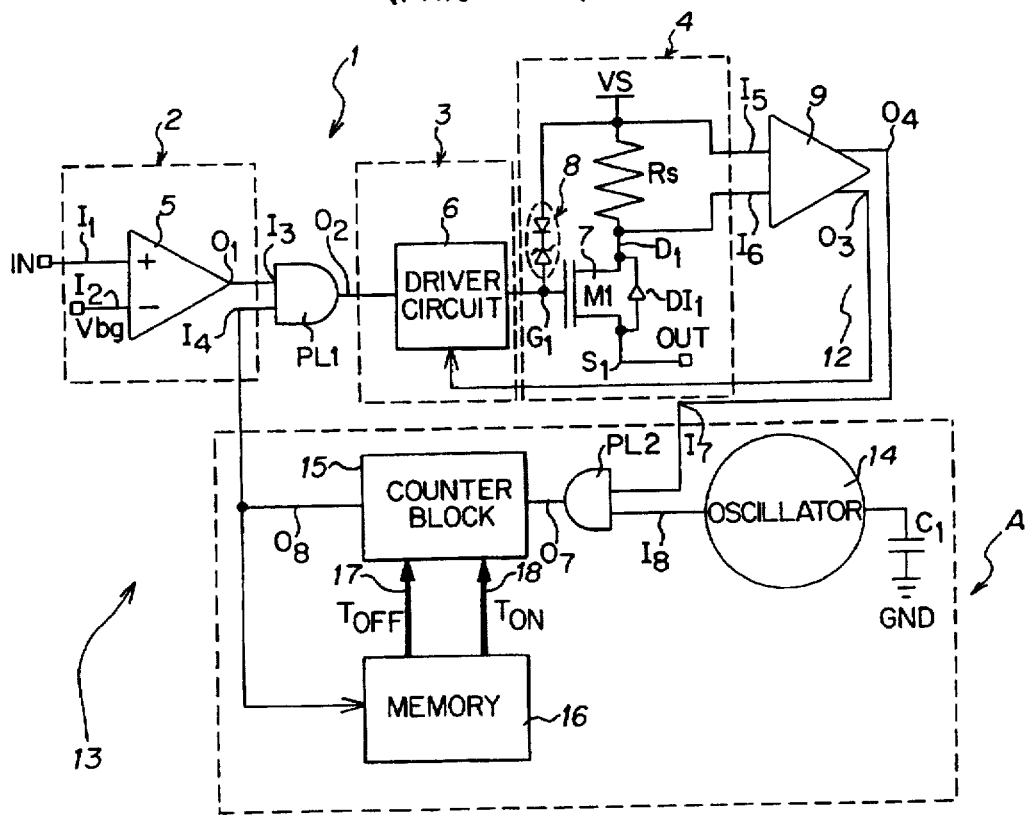
FIG. 4 illustrates an embodiment of an overload protection device according to the present invention.

The logic block 19 completes all the steps required to operate the block A of the device 13 in FIG. 4. For instance, this block 19 would control the storing of the counter 20 starting state, the loading of data from the EEPROM memories 22 and 23 into the counter block 15, etc..

The multiplexer sub-block 21 functions to select one of the values related to the on- and off-times Ton, Toff present on the buses 17 and 18 to the counter 20.

Alternatively, according to the present invention, the output OUT1 from the counter block 15 can be used as a diagnostic signal external to the integrated circuit.

The problem of how to store the data into the storage block 16 is now addressed.

Figure 6:
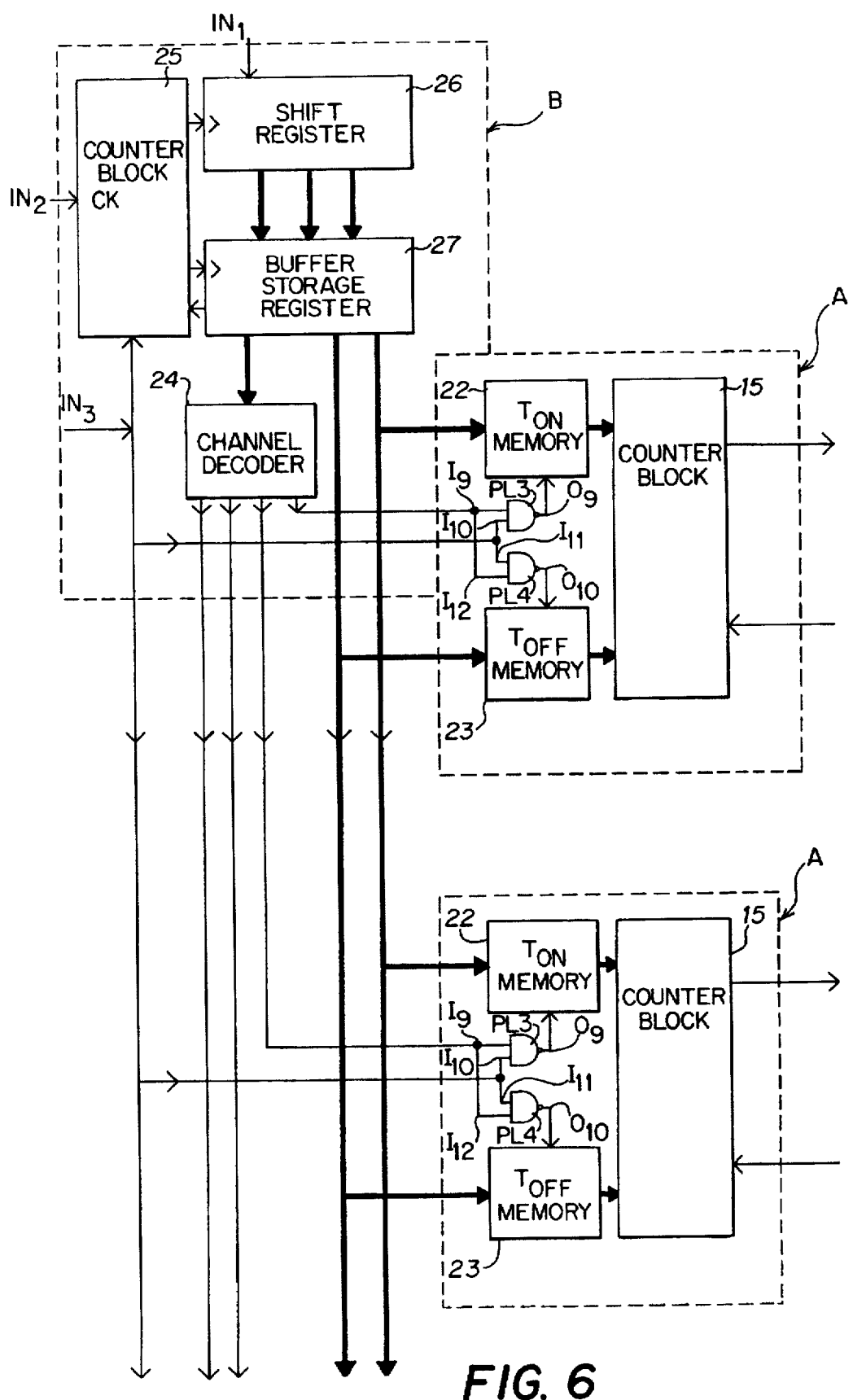
FIG. 6 illustrates a data storage device within the portion of FIG. 5.

When the memories 22 and 23 are, as in the preferred embodiment of the present invention, of the EEPROM type, the initialization circuit B shown in FIG. 6 can be used for storing the data.

The initialization circuit B has three input terminals IN1, IN2, and IN3 which are to receive signals from outside the circuit B.

The input terminal IN1 receives serially the data to be stored, and is clocked by a clock signal CK at the input terminal IN2.

The third input terminal IN3 receives a signal enabling the block B to program the storage block 16, and is kept active throughout the storing process.

Since the input terminals IN1 and IN2 are used only during the programming of the EEPROM memories 22 and 23, the invention provides for other uses of those terminals when they are not used for the programming.

The first input terminal IN1 is connected to the storage block 16 through a cascade shift register 26, a buffer storage register 27, and a channel decoder The second input terminal IN2 is connected to the counter block 25, and the third input terminal IN3 is connected to the counter block 25 and to the logic gate pair, PL3 and PL4.

The shift register 26 and the buffer register 27 are controlled through the counter block 25, by the clock signal CK generated by the oscillator circuit 14.

In particular, the circuit B is connected to the EEPROM memories 22 and 23 through a parallel of two logic AND gates PL3 and PL4 having two inputs I9, I10 and I11, I12, respectively, and one output O9 and O10, respectively.

The outputs O9 and O10 of these logic gates PL3, PL4 are respectively connected to the EEPROM memories 22 and 23, while the inputs I9 and I11 are connected together and to the program enable input IN3.

The counter block 25 is connected to the shift register 26 and the buffer register 27, which are in series with each other, and the buffer register 27 is connected to the channel decoder 24 and the memories 22 and 23.

The counter block 25, channel decoder 24 and buffer register 27 are connected to all the channels of the integrated circuit.

The operation of the device of FIG. 6 during programming of the EEPROM 22 and 23 is now discussed.

The signal at the input IN3 is first enabled and is held on throughout the programming.

The serial data to the input IN1 from the outside world is placed into the shift register 26, which is clocked through the counter block 25 by the clock signal CK.

The data pattern at input IN1 is as follows:
1. value of Ton (represented by means of N1 bits),
2. value of Toff (represented by means of N1 bits), and
3. channel number (represented by means of N2 bits).

The counter block 25 counts (2*N1+N2) clock pulses. Thereafter, the buffer register 27 receives from shift register 26, the data pattern to be decoded, allowing the shift register 26 to acquire more fresh data.

The channel decoder 24 selects the channel into which the values of Ton and Toff will be written.

The procedure described above repeats until all the EEPROM memories are programmed.

Alternatively, according to the invention, the overload protection device 13 can be streamlined by keeping the on-time Ton fixed and programming only the off-time Toff, and vice versa.

In addition, if the programming is performed only once, memories of the EPROM type may be used.

Also, if the times are fixed, the storage block 16 and the programming block B can be omitted altogether.

Figure 7:
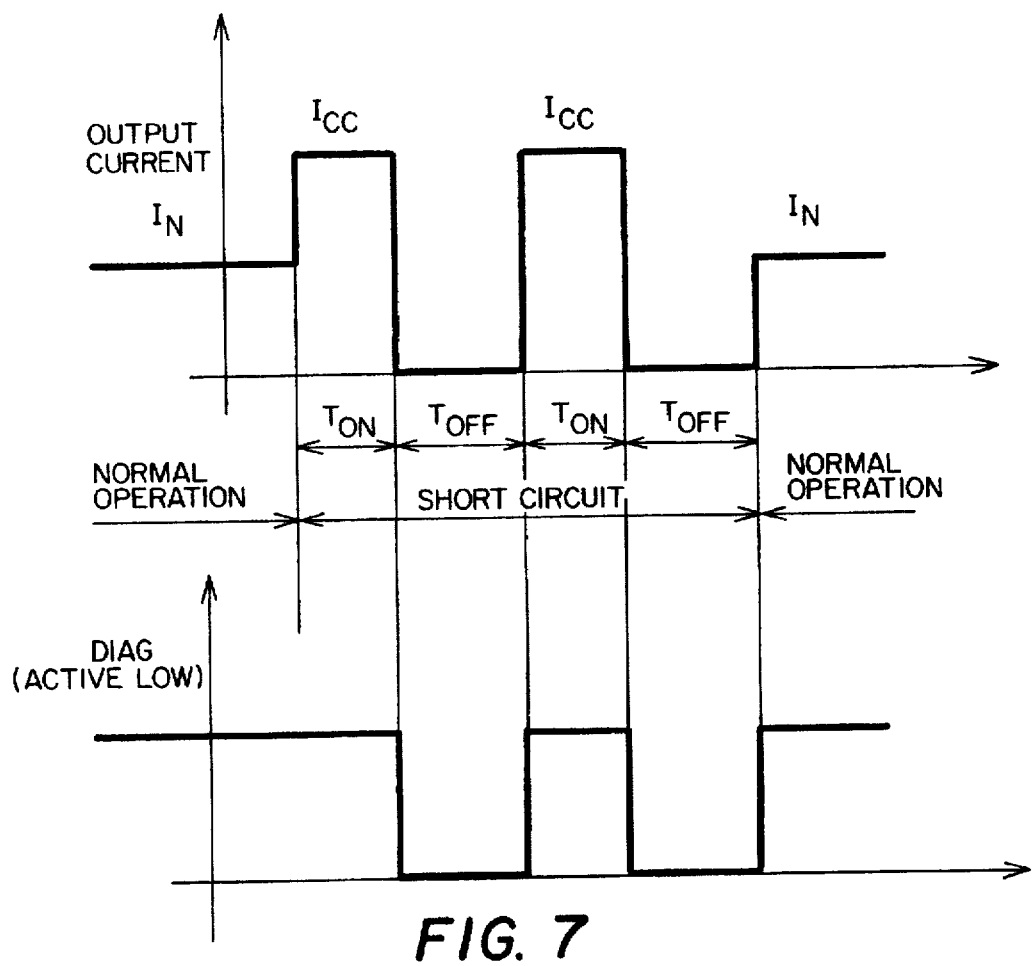
FIG. 7 shows current and voltage patterns for the circuit of FIG. 4.

Shown in FIG. 7 are patterns of the current that flow through the DMOS transistor 7 and of the voltage on the terminal OUT1 during normal and shorted conditions.

Thus, the device 13 of this invention uses a single capacitor C1 which generates a common time base, shared by all the channels of the integrated circuit.

In addition, each channel is independent of the others. On the occurrence of a current overload condition on any one channel, the protection procedure is initiated only for that channel and the operation of the other channels remain unaffected.

The on-time Ton and off-time Toff can be independently selected to meet the load requirements of each channel.

Finally, the digital implementation for generating the time intervals Ton and Toff provides superior immunity from noise, than the prior art implementation of voltage storage across capacitors.

The latter advantage is important when these integrated circuits are used in noisy industrial environments. The appearance of spurious signals, voltage and/or current spikes, or electromagnetic interference would more likely alter the charge stored on a capacitor than change the value of a written bit.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A non-dissipative device for protecting an integrated circuit having multiple independent channels against overloading, the device having an input terminal, an output terminal, and an integrated switch connected therebetween, the integrated switch having an input portion connected to a first input terminal of a first logic gate having two inputs, an output of the logic gate connected to an input of a control portion having an output connected to an output portion, the non-dissipative device comprising: a generating circuit for generating on-times and off-times of the integrated switch, the generating circuit having an input connected to an output of the output portion and an output connected to a second input terminal of said first logic gate:

wherein said generating circuit includes an oscillator connected, through a second logic gate, to a counter block which is in turn connected to an input of the first logic gate.

2. The overload protection device according to claim 1, wherein said oscillator is connected to a ground voltage through a capacitor, said oscillator providing a clock signal having a frequency that is inversely proportional to a capacitance of said capacitor.

3. The overload protection device according to claim 1, wherein said second logic gate has an input terminal connected to said input of the generating circuit.

4. The overload protection device according to claim 2, wherein said counter block is connected over buses, to a storage block.

5. The overload protection device according to claim 1, wherein said output portion includes an operational amplifier, and wherein said generating circuit includes an additional logic block connected to the operational amplifier, the oscillator, and the counter block.

6. The overload protection device according to claim 5, wherein said counter block includes a counter and a multiplexer.

7. The overload protection device according to claim 4, wherein said storage block is an EEPROM.

8. The overload protection device according to claim 7, wherein said EEPROM includes a first storage portion for storing the on-times and a second storage portion for storing the off-times.

9. The overload protection device according to claim 4, further comprising an initialization circuit connected to the storage block.

10. The overload protection device according to claim 9, wherein said initialization circuit has a first input for inputting data related to the on-times and off-times and being connected to the storage block through a shift register, a buffer storage register and a channel decoder block, and wherein said initialization circuit has a second input for receiving a clock signal provided by the oscillator and a third input for receiving an initialization enable signal, the second input and the third input being connected to the storage block through a counter and the buffer storage register.

11. The overload protection device according to claim 10, wherein said shift register and buffer storage register are connected, through the counter, to the third input.

12. The overload protection device according to claim 11, wherein said channel decoder block is connected to the buffer storage register and to a parallel of two logic gates having respective two inputs and a respective output.

13. The overload protection device according to claim 12, wherein said parallel of two logic gates have first inputs of said respective two inputs connected together and to the channel decoder block, second inputs of said respective two inputs connected together and to the third input and said respective output of said parallel of two logic gates connected respectively to the first storage portion and the second storage portion.

14. A method for obtaining on-times and off-times of an integrated switch being connected to a multi-channel integrated circuit and including a counter block and a memory element, wherein a common time base shared by all channels of the integrated circuit is used for controlling the counter block to generate the on-times and off-times from values stored in the memory element.

15. The method of claim 14, wherein a respective on-time and a respective off-time are stored for each channel of the integrated circuit.

16. The method of claim 15, wherein the on-times are stored in a first storage portion and the off-times are stored in a second storage portion.

17. The method of claim 15, wherein the common time base is generated through an oscillator connected to a ground voltage via a capacitor, said oscillator having a frequency which is inversely proportional to a capacitance of said capacitor.

18. An apparatus for protecting an integrated circuit connecting a power source to an output device, the apparatus comprising:
 a detector, connected to the output device, for detecting a current overload condition in the output device; and
 a time interval generator including:
  an oscillator having a frequency defined by a capacitor;
  a counter, connected to the detector and the oscillator, for controlling the integrated circuit to cyclically drive the output device with a cycle defined by a predetermined on-time and a predetermined off-time when a current overload condition is detected; and
  a memory, connected to the counter, for storing the predetermined on-time and the predetermined off-time.

19. The apparatus of claim 18 wherein, the output device is driven to carry a predetermined current during the predetermined on-time.

20. The apparatus of claim 18, further comprising a memory initialization circuit including:
 a data input for inputting at least one of the predetermined on-time and the predetermined off-time;
 a buffer register, connected to the data input, for temporarily storing the at least one of the predetermined on-time and the predetermined off-time; and
 a clock, connected to the buffer register, for controlling timing of writing the at least one of the predetermined on-time and the predetermined off-time into the memory.

21. The apparatus of claim 20 wherein, the memory initialization circuit further includes an enable signal, provided to the clock and the memory, to enable initialization of the memory.

22. The apparatus of claim 18 wherein, the detector includes:
 a resistor, having a first terminal and a second terminal, connected in series with the output device; and
 an operational amplifier, having a first input connected to the first terminal and a second input connected to the second terminal, and having an output that indicates a current overload condition based upon a difference between the first input and the second input.

23. The apparatus of claim 18 wherein, the memory includes:
 a first memory portion, connected to the counter, for storing the predetermined on-time; and
 a second memory portion, connected to the counter, for storing the predetermined off-time.

24. The apparatus of claim 23 wherein, the counter includes a multiplexer, connected to the first memory portion and the second memory portion, for selecting one of the predetermined on-time and the predetermined off-time as a count start value.

25. The apparatus of claim 18, wherein the apparatus is implemented in BCD (Bipolar, CMOS, and DMOS) technologies.

26. An apparatus for protecting an integrated circuit connecting a power source to a plurality of output devices, the apparatus comprising:
 a plurality of detectors, each detector being connected to a respective output device of the plurality of output devices for detecting a respective current overload condition in the respective output device; and
 a time interval generator including:
  an oscillator having a frequency defined by a capacitor;
  a plurality of counters, each counter being connected to the oscillator and to a respective detector for controlling the integrated circuit to cyclically drive an output device connected to the respective detector with a cycle defined by a respective predetermined on-time and a respective predetermined off-time when a current overload condition is detected by the respective detector; and
  a plurality of memories, each memory being connected to a respective counter for storing the respective predetermined on-time and the respective predetermined off-time.

27. The apparatus of claim 26 wherein, each output device is driven to carry a respective predetermined current during the respective predetermined on-time.

28. The apparatus of claim 26, further comprising a memory initialization circuit including:
 a data input for inputting at least one of a predetermined on-time and a predetermined off-time, and a channel signal for a memory of the plurality of memories;
 a buffer register, connected to the data input, for temporarily storing the predetermined on-time, the predetermined off-time, and the channel signal;
 a channel decoder, connected to the buffer register, that selects a memory from the plurality of memories based upon the channel signal; and
 a clock, connected to the buffer register, for controlling a timing of writing the predetermined on-time and the predetermined off-time into the memory selected by the channel decoder.

29. The apparatus of claim 28, wherein the memory initialization circuit further includes an enable signal, provided to the clock and each memory, to selectively enable initialization of at least one of the plurality of memories.

30. The apparatus of claim 26, wherein each detector includes:
 a resistor, having a first terminal and a second terminal, connected in series with the respective output device; and an operational amplifier, having a first input connected to the first terminal and a second input connected to the second terminal, and having an output that indicates a current overload condition at the respective output device based upon a difference between the first input and the second input.

31. The apparatus of claim 26, wherein each memory includes:

a first memory portion, connected to the respective counter for storing the respective predetermined on-time; and a second memory portion, connected to the respective counter for storing the respective predetermined off-time.

32. The apparatus of claim 31, wherein each counter includes a multiplexer, connected to the respective first memory portion and the respective second memory portion, for selecting one of the respective predetermined on-time and the respective predetermined off-time as a count start value.

33. The apparatus of claim 26, wherein the apparatus is implemented in BCD (Bipolar, CMOS, and DMOS) technologies.

34. A method for protecting an integrated circuit connecting a power source to an output device, the method including steps of:

A. detecting a current overload condition in the output device;

B. generating a clock signal having a frequency defined by a capacitor;

C. cyclically driving the output device with a cycle defined by a predetermined on-time and a predetermined off-time based upon the clock signal when a current overload condition is detected; and storing the predetermined on-time and the predetermined off-time.

35. A method for protecting an integrated circuit connecting a power source to an output device, the method including steps of:

A. detecting a current overload condition in the output device;

B. generating a clock signal having a frequency defined by a capacitor; and

C. cyclically driving the output device with a cycle defined by a predetermined on-time and a predetermined off-time based upon the clock signal when a current overload condition is detected; and wherein the step of counting includes a step of loading alternately one of the predetermined on-time and the predetermined off-time into a counter as a count start value.

36. A method for protecting an integrated circuit connecting a power source to a plurality of output devices, the method including steps of:

A. detecting a respective current overload condition for each output device;

B. generating a clock signal having a frequency defined by a capacitor;

C. cyclically driving each output device that has a respective current overload condition, with a respective cycle defined by a respective predetermined on-time and a respective predetermined off-time based upon the clock signal; and storing a respective predetermined on-time and a respective predetermined off-time for each output device of the plurality of output devices.

37. A method for protecting an integrated circuit connecting a power source to a plurality of output devices, the method including steps of:

A. detecting a respective current overload condition for each output device;

B. generating a clock signal having a frequency defined by a capacitor; and

C. cyclically driving each output device that has a respective current overload condition, with a respective cycle defined by a respective predetermined on-time and a respective predetermined off-time based upon the clock signal;

wherein the step of counting includes a step of loading alternately one of the respective predetermined on-time and the respective predetermined off-time into a respective counter as a count start value.

38. An apparatus for protecting an integrated circuit connecting a power source to an output device, the apparatus comprising:

a detector, connected to the output device, for detecting a current overload condition in the output device;

an oscillator providing a clock signal having a frequency defined by a capacitor;

a means for cyclically driving the output device with a cycle defined by a predetermined on-time and a predetermined off-time based upon the clock signal when a current overload condition is detected; and a means for storing the predetermined on-time and the predetermined off-time.

39. An apparatus for protecting an integrated circuit connecting a power source to a plurality of output devices, the apparatus comprising:

a plurality of detectors, each detector of the plurality of detectors being connected to a respective output device for detecting a respective current overload condition;

an oscillator providing a clock signal having a frequency defined by a capacitor;

a means for cyclically driving each output device that has a current overload condition with a respective cycle defined by a respective predetermined on-time and a respective predetermined off-time based upon the clock signal: and a means for storing the respective predetermined on-time and the respective predetermined off-time for each output device.

* * * * *